United States Patent
Shirasawa

(10) Patent No.: US 6,249,279 B1
(45) Date of Patent: Jun. 19, 2001

(54) DATA LINE DRIVE DEVICE

(75) Inventor: Hiroshi Shirasawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/199,317

(22) Filed: Nov. 25, 1998

(30) Foreign Application Priority Data

Nov. 26, 1997 (JP) .................................................. 9-324090

(51) Int. Cl.⁷ ................................ G09G 3/28; G09G 5/00
(52) U.S. Cl. ........................ 345/211; 345/204; 315/169.1
(58) Field of Search ..................................... 345/204, 211, 345/60, 79; 315/169.1

(56) References Cited

U.S. PATENT DOCUMENTS

| | | |
|---|---|---|
| 4,866,349 | 9/1989 | Weber et al. . |
| 5,294,919 | * 3/1994 | Harju ..................... 345/79 |
| 5,654,728 | 8/1997 | Kanazawa et al. . |
| 5,717,437 | * 2/1998 | Sano et al. ............................ 345/211 |
| 5,739,641 | * 4/1998 | Nakamura et al. ................ 315/169.1 |
| 5,943,030 | * 8/1999 | Minamibayashi ...................... 345/60 |

FOREIGN PATENT DOCUMENTS 2 741 741   5/1997 (FR) .

8-160901   6/1996 (JP) .
8-254339   9/1996 (JP) .
8-267261   10/1996 (JP) .

* cited by examiner

*Primary Examiner*—Bipin Shalwala
*Assistant Examiner*—David L. Lewis
(74) *Attorney, Agent, or Firm*—Sughrue, Mion, Zinn, Macpeak & Seas, PLLC

(57) ABSTRACT

For saving power by recovery and reuse of charge on data lines of a matrix display panel, a data line drive device, has a simplified circuit configuration. The device comprises a matrix display panel having a plurality of data lines DL; a data line drive circuit 1A for driving said data lines DL, including a plurality of switch units QP1i, QN1i (i=1 to N) interposed between a data voltage applying terminal P12 and each of said data lines DL; electrostatic charge storage means C11, L11 for storing electrostatic charge on said data lines, which is connected to said data drive circuit 1A; and a switch QS1i for recovering the charge, having a parasitic diode DS1i which is interposed between said data line drive circuit 1A and each of said data lines, said charge recovering switch QS1i being brought into a conductive state when the charge on the data lines is recovered to said charge storing means C11, L11.

9 Claims, 10 Drawing Sheets

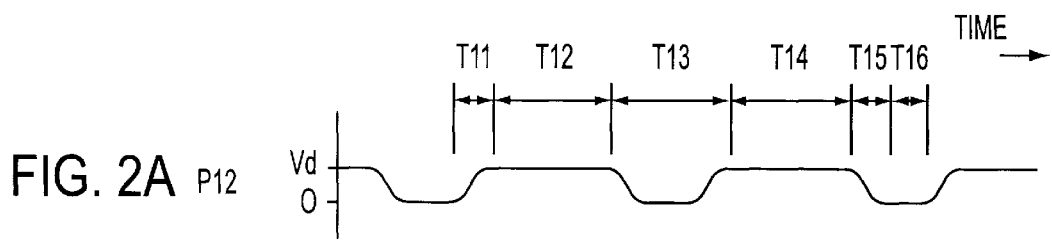
FIG. 2A P12
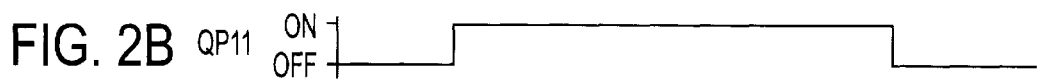
FIG. 2B QP11
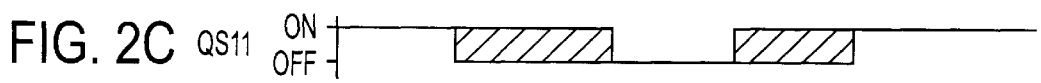
FIG. 2C QS11
FIG. 2D QN11
FIG. 2E PZ11
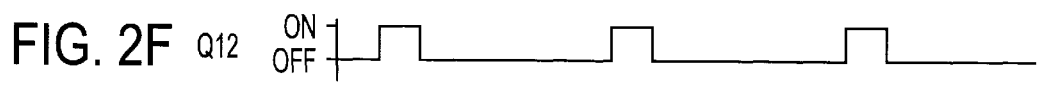
FIG. 2F Q12
FIG. 2G Q11
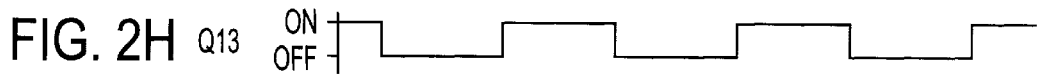
FIG. 2H Q13

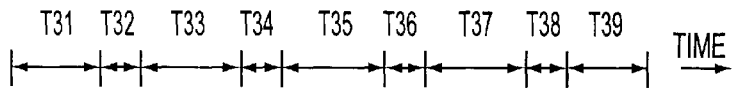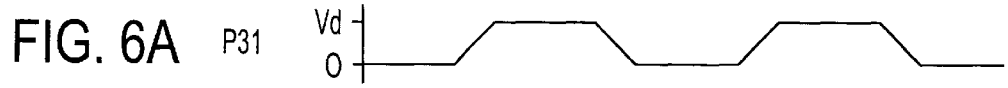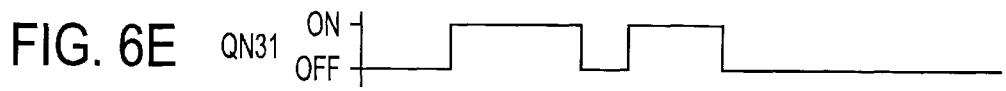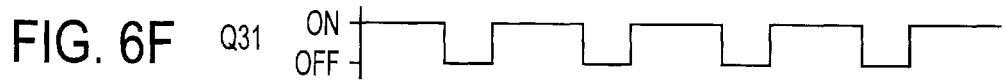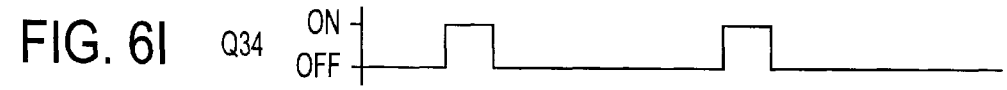

FIG. 9A WAVE FORM 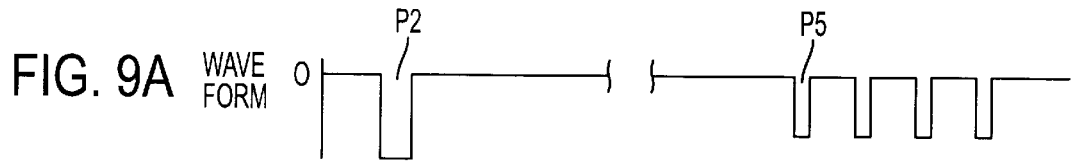
FIG. 9B WAVE FORM 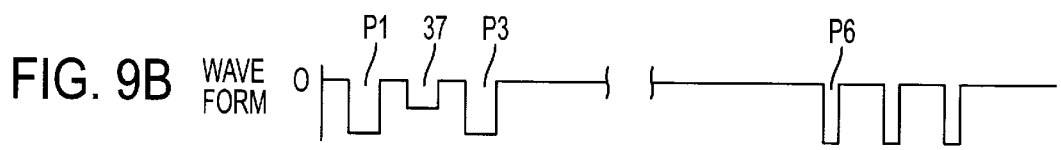
FIG. 9C WAVE FORM 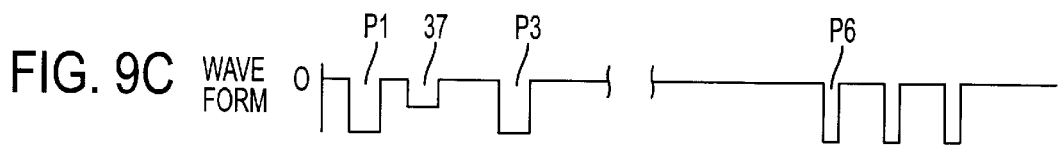
FIG. 9D WAVE FORM 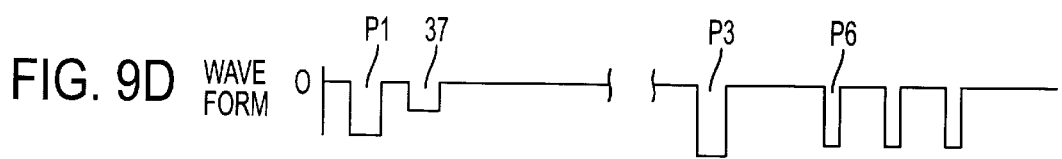
FIG. 9E WAVE FORM 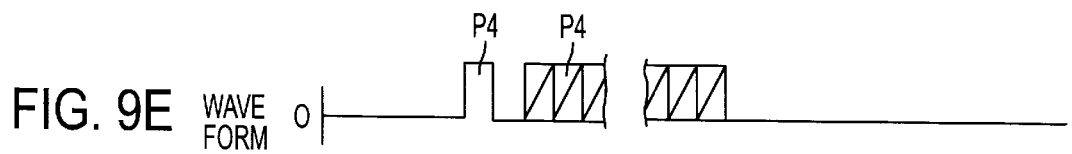
FIG. 9F WAVE FORM 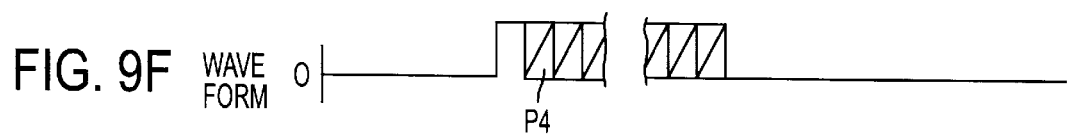
FIG. 9G WAVE FORM 
(PRIOR ART)

DATA LINE DRIVE DEVICE

FIELD OF THE INVENTION

The present invention relates to a matrix display panel such as a plasma display, liquid crystal panel, electroluminescent panel and the like, and in particular to a data line drive device for driving the matrix of the display panel.

RELATED ART

Typical matrix display panel include plasma display, liquid crystal panel, electroluminescent panel and the like. The present invention will be described with reference to a plasma display panel. Referring now to FIG. 7, there are shown only the lines of the plasma display panel. PDP denotes a plasma display panel. First and second insulating substrates 11 and 12 which will be described hereafter are sandwiched at a seal portion along the periphery of the panel so that a space therebetween is filled with a discharge gas. $S_1, S_2, \ldots, Sm$ denote scanning lines. $Ca_1, Ca_2, Cam$ denote hold lines. $Da_1, Da_2, Dam-1, Dan$ denote data lines. SDR denotes a circuit driving the scanning lines. CDR denotes a circuit driving the hold lines. DDR denotes a circuit driving the data lines. A display cell CELL at an intersection between ith scanning line and jth data line is represented by aij.

The section of the plasma display panel PDP is shown in FIG. 8. FIG. 8 is a sectional view taken along the data line in FIG. 7. In FIG. 8, a reference numeral 11 denotes the first insulating substrate made of glass; 12 the second insulating substrate also made of glass; 13 a data line of a metallic electrode; 14 an insulating layer covering the data line 13; 15 a barrier made of an insulating material such as glass; 16 a fluorescent material; 17 a scanning line including a transparent electrode such as NESA electrode; 18 a hold line including a transparent electrode such as NESA electrode; 19 a bus line made of a metal used for lowering the resistance of the scanning line 17 and the hold line 18; 20 a thick insulating layer; 21 a barrier made of an insulating material; 22 a protective layer made of MgO and the like for protecting the insulating layer from gas discharge; and 23 a discharge gas space which is filled with a discharge gas such as rare gas for exiting the fluorescent material with electric discharge. Preferable display direction of image is shown by an arrow in FIG. 8.

Referring now to FIG. 9, there is shown an example of the drive voltage waveform and light emission waveform of the plasma display panel which is shown in FIGS. 7 and 8. Waveform (A) denotes the waveform of the voltage which is applied to the hold lines $Ca_1, Ca_2, Cam$. Waveform (B) denotes the waveform of the voltage which is applied to the scanning line $S_1$. Waveform (C) denotes the waveform of the voltage applied to the scanning line $S_2$. Waveform (D) denotes the waveform of the voltage applied to the scanning line Sm. Waveform (E) and (F) denote the waveforms of the voltages which are applied to the data lines $Da_1$ and $Da_2$, respectively. Waveform (G) denotes the waveform of the light emission from a display cell $a_{11}$. The hatching of pluses in the waveforms (E) and (F) shows that presence or absence of the pulse is determined in accordance with the presence or absence of data to be written.

Now, operation is described. Firstly, electric discharge which has been sustained is eliminated with an eliminating pulse P1. Then, a priming pulse P2 is applied to all the hold lines 18 so that priming discharge occurs over the entire area of the panel, generating priming particles which will become seeds for electric discharge on writing of the display data. Then, a priming eliminating pulse 37 is applied to all scanning lines while the priming discharge will not induce sustained discharge. Then, electric discharge for writing display data by applying a data pulse P4 to the data line $D_1, D_2, \ldots, D_{n-1}, D_n$ in synchronization with the scanning pulse P3 applied to the scanning lines $S_1, S_2, \ldots, Sm$. FIG. 9 shows that data is written into the display cells $a_{11}, a_{22}$, no data is written into the display cells $a_{12}, a_{21}$, display of the display cells other than the display cells $a_{11}, a_{22}, a_{12}, a_{21}$, at first and second rows and the display cells at third and following rows is achieved depending on presence and absence of the data. Sustained discharge is achieved between the scanning and hold lines 17 and 18 with the application of hold pulses P5 and P6 in the display cell 24 in which discharge for writing has been conducted. The display brightness is controlled by changing the number (frequency) of applications of the hold pulses P5 and P6.

In the above-mentioned prior art driving method, however, power is required for charging or discharging electrostatic charges also on the scanning lines other than those which are not used for data writing each time when data on each scanning line is written in addition to power required for applying pulses on the data lines in the matrix display panel to drive the data line for writing data thereon. Besides, it is required to carry out charging and discharging of the electrostatic charge between neighboring data lines of the matrix display panel. Accordingly, the power consumption is high since power is required for writing data in addition to the power inherently necessary for displaying the matrix display panel. The problem becomes more significant as the matrix display panel becomes higher in display definition and larger in size.

Therefore, an electrostatic charge recovering circuit has been proposed which recovers the power used for discharging or charging the electrostatic charges of the panel with pulses in order to reduce the consumption of the power used for driving data lines of the matrix display panel as is described in, for example, Japanese Patent Kokai JP-A-Hei-8-16090(1996). This circuit is described with reference to FIG. 10. In the drawing, a reference Z100 denotes an integrated circuit for driving data lines of the matrix display panel; P100 denotes a terminal for applying a d.c. voltage used for recovering electrostatic charges having a half of the data voltage Vd; P101 a terminal for applying a d.c. voltage having a data voltage Vd; P102 a terminal of the integrated circuit Z100 for recovering the charges; P103 a grounded terminal of the integrated circuit Z100; P104 a terminal of the integrated circuit Z100 for inputting a data voltage Vd.

References D100 to D102 denote diodes; C100 a capacitor for recovering the charge stored in a resultant electrostatic capacitance of the data line, the electrostatic charge on which is to be recovered and an auxiliary capacitor; C101 an auxiliary capacitor which reduces the rate of changes in the recovered electrostatic charge due to changes in the electrostatic capacitance of the data lines of the matrix display panel, the charge on which is to be recovered; L100 denotes a coil for recovering the charge; Q100 an N channel FET; Q101 denotes a P channel FET; QA100 to QA10N denote high breakdown voltage N channel transfer gates in the integrated circuit Z100; QN 100 to QN10N high breakdown voltage N channel FETs in the integrated circuit Z100; QP100 to QP10N high breakdown voltage P channel FETs in the integrated circuit Z100; DN100 to DN10N denote parasitic diodes of the N channel FETs (QN100 to QN10N); DP100 to DP10N parasitic diodes of the P channel FETs (QP100 to QP10N).

References PZ100 to PZ10N denote output terminals of the integrated circuit Z100, which are connected to the data lines of the matrix display panel; 100A denotes a switch unit comprising the FETs Q100, 0101 and the diodes D101, D102; 100B denotes a switch unit comprising the above-mentioned FETs QP100, QN100; the parasitic diodes DP100, DN100; and the transfer gates QA100 (to QA10N); and 100C denotes a data line of the matrix display panel.

The charge recovering circuit serves to recover the charge accumulated on each of the data lines of the matrix display panel to the charge recovering capacitor C100 by the resonation effect through the output terminal PZ100 to PZ10N of the integrated circuit Z100, the switch unit 100B, the charge recovering coil L100, and the switch unit 100A. In a reverse path, the charge stored in the charge recovering capacitor C100 is recovered to each of the data lines of the matrix display panel by the resonation effect. The charge recovering circuit is capable of interrupting the transfer of the charge by turning off the transfer gates QA100 to QA10N in the switch unit 100B when the state of any data lines of the matrix display panel does not change in time series.

SUMMARY OF THE DISCLOSURE

However, a problem which will be described occurs in the circuit in the above-mentioned Japanese Patent Kokai JP-A-Hei 8-160901. First, when the charge on the data lines of the matrix display panel is recovered or reused, the charge is discharged to the d.c. voltage Vd of the terminal P101 through the parasitic diodes DP100 to DP10N if the voltages on the terminals PZ100 to PZ10N exceed the data voltage Vd. Since recovery or reutilization of the electrostatic charge is achieved by the resonation effect in the above-mentioned circuit, overshoot of the voltage on the terminals PZ100 to PZ10N frequently occurs, so that the voltage very often exceeds the data voltage Vd. Second, since the source voltage of the transfer gates QA100 to QA10N is not stable and the gates are driven on a floating basis, the circuit for driving the transfer gates QA100 to QA10N becomes more complicated. Turning on or off of the transfer gates should be always controlled along the time series. Thus much power is required for driving the transfer gates QA100 to QA10N. Third, there is a loss of power due to the resistance of the channels since recovering or reuse of the charge uses channels of the transfer gates QA100 to QA10N. Fourth, the above-mentioned circuit requires a wiring area extending from the charge recovering terminal P102 to the transfer gates QA100 to QA10N. The wiring may require a wire width comparable to the power supply line in the vicinity of the charge recovering terminal P102. Thus increase in IC area is inevitable.

It is therefore an object of the present invention to implement recovery of electrostatic charge in a data line drive device for a matrix display panel in a simple, inexpensive and effective manner.

In a first aspect of the present invention, a data line drive device comprises a matrix display panel having a plurality of data lines; a data line drive circuit which drives the data lines, including a plurality of switch units interposed between a data voltage terminal and each of the data lines; electrostatic charge storage means storing electrostatic charge on said data lines, which is connected to the data drive circuit; and a switch which recovers the charge, having a parasitic diode which is interposed between the data line drive circuit and each of said data lines, said charge recovering switch being brought into a conductive state when the charge on the data lines is recovered to the charge storing means. The charge recovering switch preferably comprises semiconductor switch elements, the parasitic diodes being parasitic between switch elements and their polarities being arranged so that the data voltage is applied to said data lines.

In accordance with a second aspect of the present invention, a data line drive device comprises a matrix display panel having a plurality of data lines, a dataline drive circuit which drives the data lines, including a plurality of switch units interposed between a data voltage terminal and each of the data lines; electrostatic charge storage means storing electrostatic charge on the data lines, which is connected to the data drive circuit; a first switch interposed between a data voltage terminal of the data line drive circuit and a data voltage source; a second switch interposed between the ground terminal of the data line drive circuit and the ground; a third switch interposed between the data voltage terminal and the charge storage means; a fourth switch interposed between the ground terminal and the charge storage means; and first and second diodes which are in series connected with the third and fourth switches, respectively, the first and second diodes having such polarities that the charge is recovered and reused between the data line drive circuit and the charge storage means.

In a third aspect of the present invention, a data line drive device comprises a matrix display panel having a plurality of data lines; a data line drive circuit which drives the data lines, including a plurality of switch units interposed between a data voltage terminal and each of the data lines; a first and second electrostatic charge storage means storing electrostatic charge on the data lines, which is connected to the data drive circuit; a first switch interposed between a data voltage terminal of the data line drive circuit and a data voltage source; a second switch interposed between the ground terminal of the data line drive circuit and the ground; a third switch interposed between the data voltage terminal and the charge storage means; a fourth switch interposed between the ground terminal and the first charge storage means; a fifth switch interposed between the data voltage terminal and the second charge storage means; a sixth switch interposed between the ground terminal and the second charge storage means; and first to fourth diodes which are in series connected with the third to sixth switches, respectively, the first to fourth diodes having such polarities that the charge is recovered and reused between the data line drive circuit and the first or second charge storage means.

In accordance with the first aspect of the present invention, even when the voltage of the data line exceeds the data voltage due to overshoot on recovery or reuse of the charge on the data line of the matrix display panel, the change can be efficiently recovered since there is no path along which the power corresponding to overshoot is discharged to a data voltage source. The number of activations of the switch for controlling the recovery or non-recovery of the charge can be reduced and the configuration of the whole circuit can be simplified, resulting in a saving of power. This simplification of the circuit configuration allow a reduced resistance on recovery or reuse of the charge. Further, there is no necessity of terminal or wiring for recovering the charge, which contributes to simplification of the circuit.

In accordance with the second aspect of the present invention, discrimination between recovery and non-recovery of charge can be achieved without using any switch for controlling the charge recovery for each data line of the matrix display panel. The circuit configuration can be further simplified since the data voltage terminal and grounded terminal are used for recovery or reuse of the charge. In accordance with the third aspect of the invention, in addition to an advantage which is similar to that obtained in the second aspect of the invention, the time which is required for recovery or reuse is reduced to a half of the time since the operation of recovery or reuse of the charge can be conducted simultaneously, as contrasted to the second aspect.

BRIEF DESCRIPTION OF THE DRAWINGS

FIGS. 2(A)–(H) are views showing waveforms in the first embodiment of the present invention.

FIGS. 6(A)–(K) are views showing waveforms in the third embodiment of the present invention.

FIGS. 9(A)–(G) are views showing an example of waveforms of drive voltage for the prior art plasma display panel.

PREFERRED EMBODIMENT OF THE INVENTION

Figure 1:
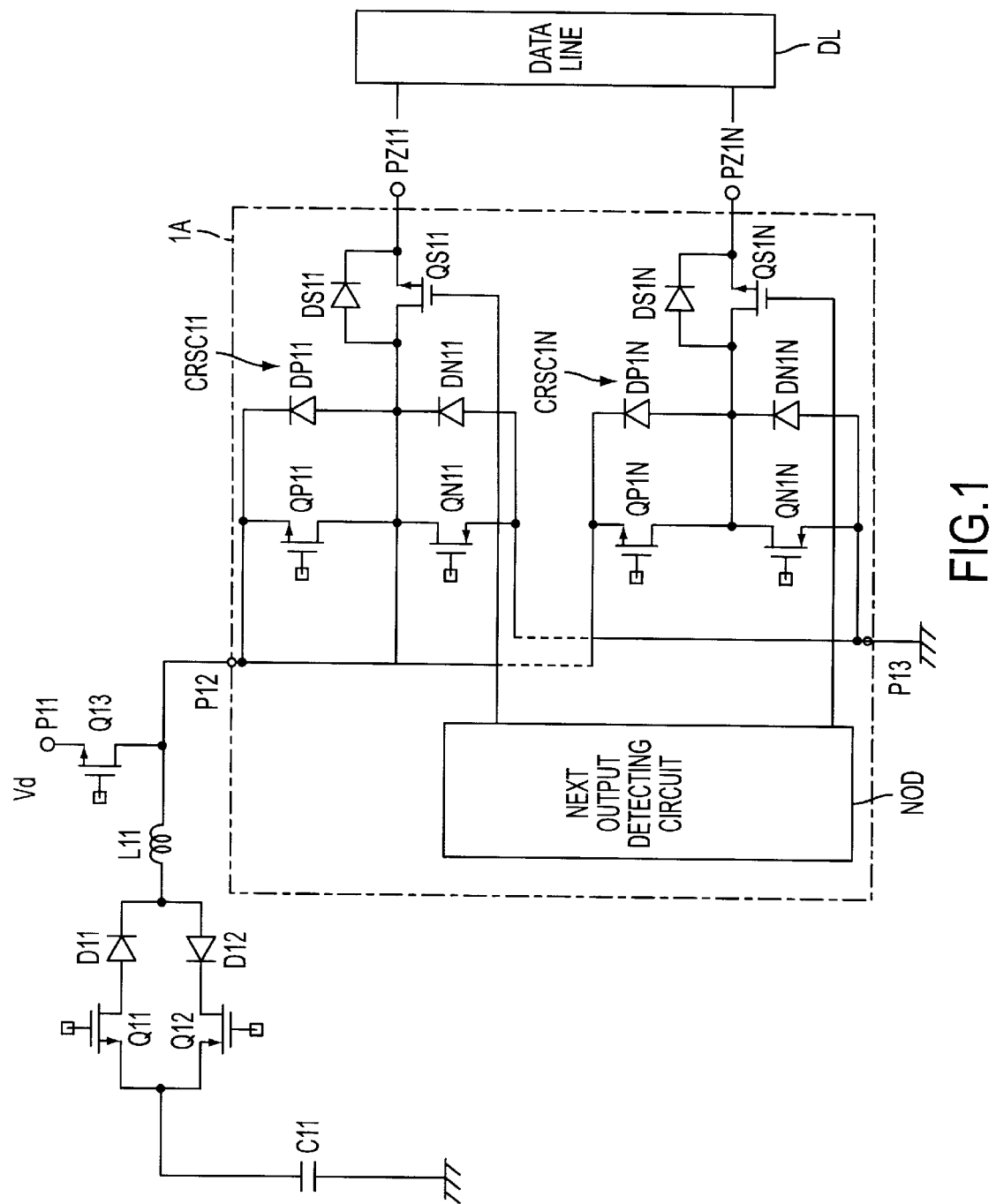
FIG. 1 is a circuit block diagram of a first embodiment of the present invention.

Embodiments of the data line drive circuit of the present invention will be described in detail with reference to the drawings. In this embodiment, FETs are used as switches for turning on or off a high voltage. Any diode which makes use of the parasitic effect of FET will be referred to as parasitic diodes. The configuration of the data line drive circuit of the first embodiment is illustrated in FIG. 1. In the drawing, a reference P11 denotes a terminal for applying a d.c. voltage having a data voltage Vd; P12 denotes a terminal for inputting a data voltage of an integrated circuit 1A used as the data line drive circuit; and P13 denotes a grounded terminal of the integrated circuit 1A used as the data line drive circuit; and P13 denotes a grounded terminal of the integrated circuit 1A. Q13 denotes a P channel FET which serves as a switch which is activated on application of the data voltage. C11 denotes a capacitor for recovering the charge; L11 a coil for recovering the charge; D11 and D12 diodes; Q11 and Q12 denote P and N channel FETs which are used as switches to be activated on recovery of the charge, respectively. The diodes D11, D12 and the FETs QP11, Q12 constitute a switch unit for recovering the charge.

On the other hand, QN11 to QN1N denote N channel FETs; QP11 to QP1N denote P channel FETs; DN11 to DN1N denote parasitic diodes of the N channel FETs QN11 to QN1N; DP11 to DP1N denote parasitic diodes of the P channel FETs QP11 to QP1N. These elements constitute a switch unit for applying a data voltage to control the application of the data voltage to the data lines DL which are connected to a plurality of output terminals PZ11 to PZ1N. A charge recovering switch circuit comprising each of the P channel FETs QS11 to QS1N and each of their corresponding their parasitic diodes DS11 to DSLN is interposed between each data line DL and the data voltage applying switch unit corresponding to each data line. A next output detecting circuit NOD for detecting next output is connected to the gates of the FETs QS11 to QS1N of the charge recovering switch circuit CRSC11 to CRSC1N.

Voltage waveforms in a circuit of the embodiment of the present invention shown in FIG. 1 are illustrated in FIG. 2. Operation of the circuit shown in FIG. 1 is described with reference to voltage waveforms in FIG. 2. The time intervals T11, T13, T15 and T16 denote transition intervals between turning on and off of the data pulses. Time intervals T12 and T14 denote intervals during which the data pulses are clamped to a constant voltage. Operation of the circuit for applying pulses to the data lines is described with reference to the waveform (E) in FIG. 2 of the voltage on the output terminal PZ11, which is a data pulse waveform. During the interval T11, no data pulse is applied to the output terminal PZ11 which is connected to the data line, and the potential on the output terminal PZ11 is raised as shown at (E) in FIG. 2. The FETs Q11, QP11 and QS11 are brought into a conductive state to cause the charge stored in the charge recovering capacitor L11 to be charged into the data line LD by the resonation effect through the FET Q11, diode D11, coil L11, FETs QP11, OS11, or the parasitic diode DS11 of the FET QS11 and the output terminal PZ11. It is predicted that a voltage exceeding the data voltage Vd is spontaneously applied to the output terminal PZ11, since the electrostatic charge is transferred due to the resonation effect. However, there is no path for discharging the electrostatic charge, and all the charge will be charged on the data line. At this time FET QS11 may be inconductive since the diode DS11 is conductive.

During the time interval T12, the data line which is connected to the output terminal PZ11 is clamped to the data voltage Vd by bringing the FET Q13 conductive. At this time, the FET QS11 may be inconductive as is similar during the interval T11. During the time interval T11, the state in which the voltage on the data line which is connected to the output terminal PZ11 is also Vd at next output phase is detected by the next output detecting circuit to bring the FET QS11 inconductive so that the charge on the data line connected to said output terminal PZ11 is not recovered. The charge on the data line connected to the output terminal PZ is not recovered since the conducting path is interrupted. During the time interval T14, the data line which is connected to the output terminal PZ11 is clamped to the data voltage Vd as is similar during the interval T12. At this time, the FET QS11 may be inconductive as is similar during the interval T11. The state in which the voltage Vd on the data line connected to the output terminal PZ11 is not Vd on next output phase is detected by the next output detecting circuit during the time interval T15 to bring the FETs Q12, QS11 conductive for recovering the charge on the data line connected to the output terminal PZ11. The charge on the data line is charged to the charge recovering capacitor C11 by the resonation effect through the output terminal PZ11, the FET QS11, parasitic diode DP11 of FET QP11, coil L11, diode D12 and FET Q12 for lowering the potential on the data line. The time interval T16 is provided to establish a timing relationship between charging and discharging.

Repeating the above-mentioned operation causes the charge to be effectively recovered or reused without losing the power due to overshooting on the data lines of the matrix display panel. The number of activation of the switching transistors for controlling the recovery or non-recovery of the charge is less, so that the configuration of the whole of the circuit can be simplified, resulting in a save in power. Simplification of the configuration of the circuit can decrease the power loss, which otherwise occurs, due to a reduced electric resistance on the recovery or reuse of the charge. No necessity of additional terminals or wiring for recovering the charge also contributes to simplification of the circuit.

Figure 3:
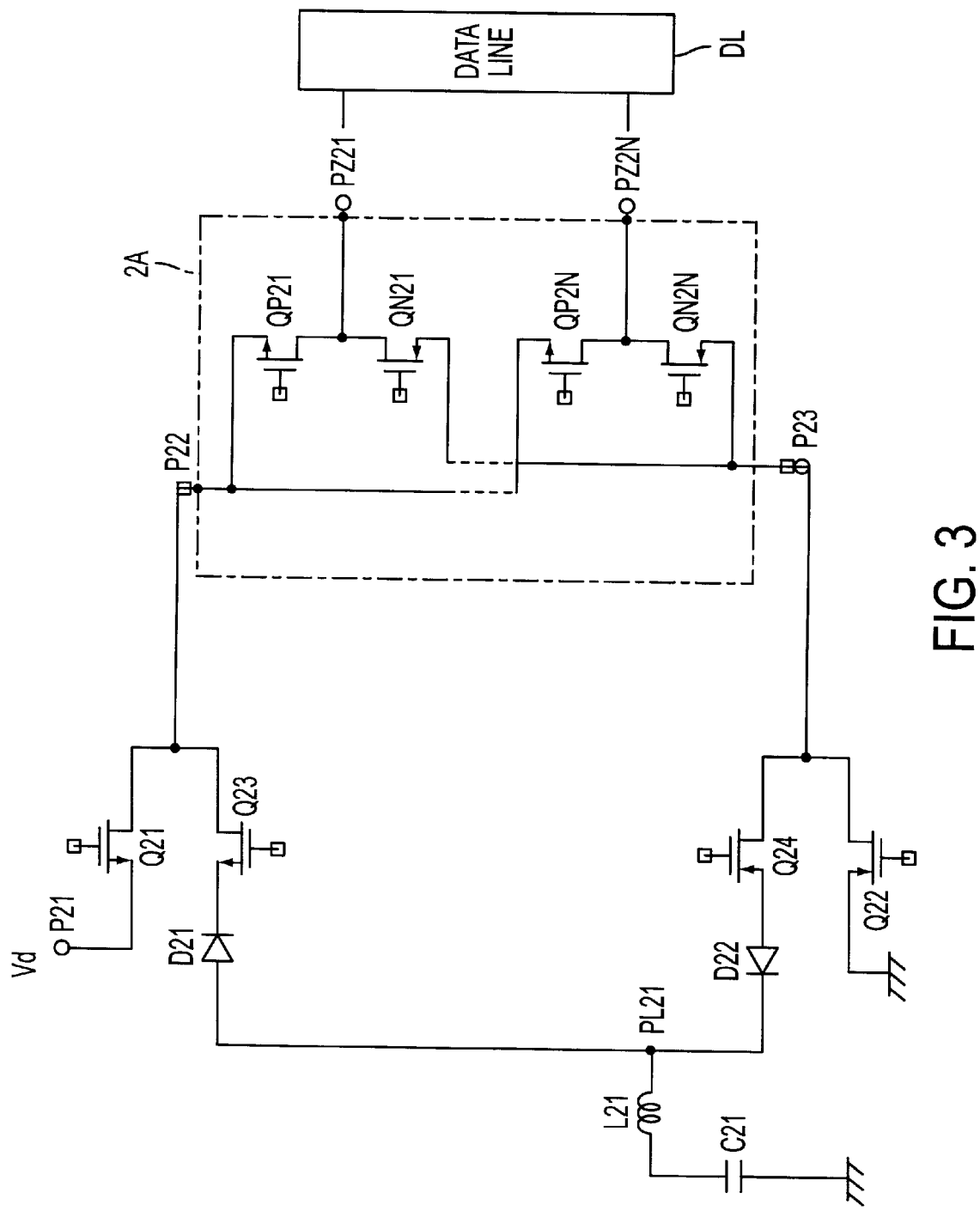
FIG. 3 is a circuit block diagram of a second embodiment of the present invention.
Figure 4A:
FIGS. 4(A)–(H) are views showing waveforms in the second embodiment of the present invention.
Figure 4B:
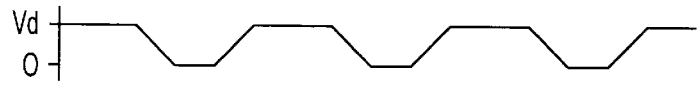
Figure 4C:
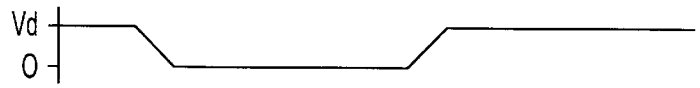
Figure 4D:
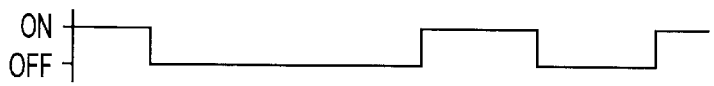
Figure 4E:
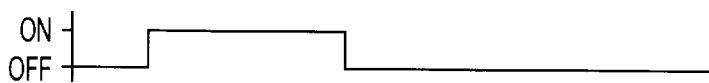
Figure 4F:
Figure 4G:
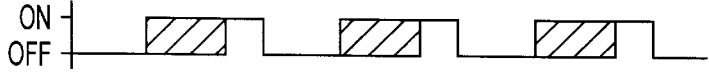
Figure 4H:
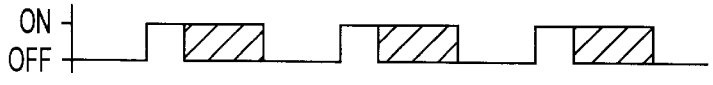

A second embodiment of the data line drive circuit of the present invention will be described in detail with reference to FIGS. 3 and 4. FIG. 3 shows the configuration of the second embodiment of the data line drive circuit of the present invention. In the drawings, a reference P21 denotes a terminal for applying a d.c. voltage of the data voltage Vd; P22 a terminal for inputting the data voltage of the integrate circuit 2A which serves as the data line drive circuit; P23 a grounded terminal of the integrated circuit 2A; PZ21 to PZ2N denote output terminals which are connected to the data lines DL. QN21 to QN2N denote N channel FETs and QP21 to QP2N denote P channel FETs. These elements constitute a data voltage applying switch unit for applying the data voltage on the data lines DL which are connected to the output terminals PZ21 to PZ2N. Q21 and Q23 denote P channel FETs which constitute a data voltage applying switch and charge recovering switch, respectively. Q22 and Q24 denotes N channel FETs, which constitute a grounding switch and charge recovering switch, respectively. D21 and D22 denote diodes which are in series connected with FET Q23 and FET Q24, respectively and are connected to a series circuit comprising a charge recovering coil L21 and charge recovering capacitor C21 at a coupling point between the diodes D21 and D22. PL21 represents a potential on the anode of the diode D21 (cathode of the diode D22).

Voltage waveforms in a circuit of the embodiment of the present invention shown in FIG. 3 are illustrated in FIG. 4. Operation of the circuit shown in FIG. 3 is described with reference to voltage waveforms in FIG. 4. The time intervals T22, T26 and T2A denote intervals during which the charge of the data pulses is recovered to the charge recovering capacitor, and the time intervals T24, T28 and T2C denote intervals during which the charge on the recovering capacitor C21 is reused as (transferred to) data pulses. Time intervals T21, T25 and T29 denote intervals during which the data pulses are clamped to a constant voltage. Operation of the circuit for applying pulses to the data lines is explained with reference to the waveform of the voltage on the output terminal PZ21 in FIG. 4(B) showing the data pulse waveform. During the interval T21, a data pulse is applied to the output terminal PZ21 which is connected to the data line so that the voltage on the terminal is clamped to the data voltage Vd. During interval T22, the potential on the data line connected to the output terminal PZ21 is lowered as shown in FIG. 4(B). By bringing FETs QN21 and Q24 conductive, the charge accumulated on the data line is charged on the charge recovering capacitor C21 with the resonation effect through the output terminal PZ21, FET QN21, Q24, diode D22 and coil L21 for lowering the potential of the data line. Time interval T23 is a transition interval to establish a timing relationship between charging and discharging of the charge recovering capacitor. During the time interval T24, the potential on the data line connected to the output terminal PZ21 remains lowered, during which FETs QN21 and FET QP21 are brought into conductive and inconductive states, respectively. The charge conducting path of the data line which is connected to the output terminal PZ21 is interrupted, so that the charge accumulated on the charge recovering capacitor C21 is not reused.

During time interval T25, the data line which is connected to the output terminal PZ21 is clamped to 0V which is the ground potential by bringing the FET Q22 conductive. During time interval T26, recovering of the charge is not conducted since no data pulse is applied to the data line which is connected to the output terminal PZ21. The FET QN21 is rendered inconductive in order to prevent the charge from flowing from the other output terminal. Operation during time interval T27 is identical with that during time interval T23. During time interval T28, the potential on the data line connected to the output terminal PZ21 is raised. By bringing the FETs Q23 and QP21 conductive, the charge charged on the charge recovering capacitor C21 is charged on the data line connected to the output terminal PZ21 due to the resonation effect through the coil 21, Diode D21, FETs Q23 and QP21 and the output terminal PZ21 for raising the potential on the data line. Since the charge is transferred with the resonation effect, it is predicted that a voltage exceeding the data voltage Vd is only spontaneously applied to the output terminal PZ21. However, all the charge is charged on the data line since there is no path along which the charge is discharged.

During time interval T29, the data line which is connected to the output terminal PZ21 is clamped to Vd by bringing the FET Q21 conductive. During time interval T2A, the data pulse potential Vd is maintained at the data line connected to the output terminal PZ21 while FET Q21 turns OFF. Also the FET QP21 is brought into an inconductive state in order to prevent the flowing of the charge to the other output terminal. Operation during the time interval T2B is identical with that during the time interval T23. During time interval T2C, the FETs QP21, QN21 are rendered conductive and inconductive, respectively, in order to maintain Vd at and avoid flowing out of the charge to the other output terminals from the data line connected to the output terminal PZ21.

Repeating the above-mentioned operation causes the charge to be effectively recovered or reused without losing the power caused by overshooting on the data lines of the matrix display panel. The circuit configuration is remarkably simplified since discrimination (separation) between the charge recovering line and non-recovering line is conducted without using any special switch which controls the recovery and non-recovery of the charge for each data line. Besides the terminal for applying a d.c. voltage of the data voltage Vd and grounded terminal are used for recovery or reuse of the charge. Simplification of the circuit configuration allows the resistance on recovery or reuse of the charge to be reduced. It is necessary to prevent the formation of parasitic diodes on FETs QN21 to QN2N, QP21 to QP2N by using a process to isolate dielectric materials when the data line drive circuit used in the present invention is fabricated.

Figure 5:
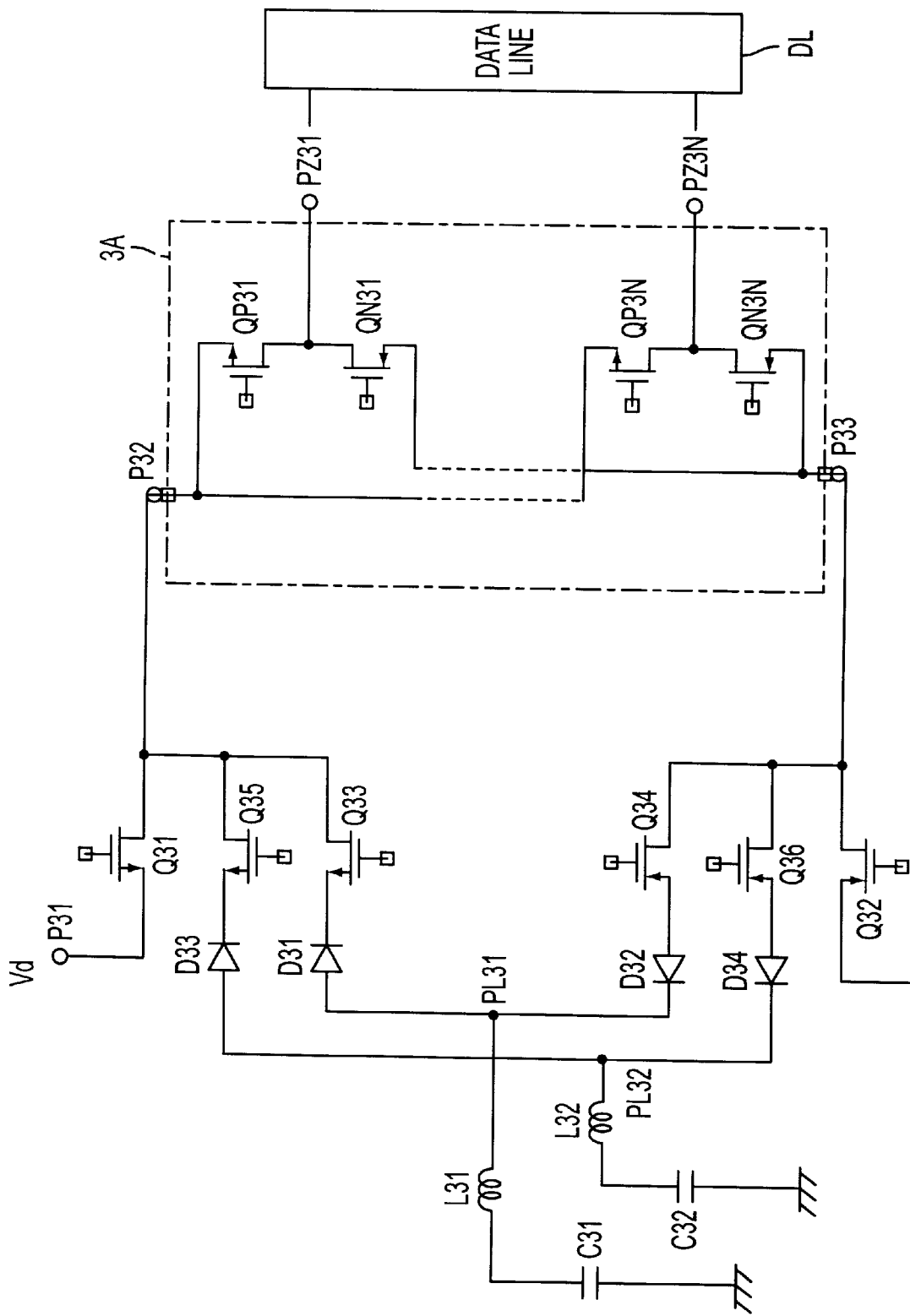
FIG. 5 is a circuit block diagram of a third embodiment of the present invention.

A third embodiment of the data line drive circuit of the present invention will be described with reference to FIGS. 5 and 6. The third embodiment is a modification of the second embodiment in which the recovery of the charge on the data lines is conducted simultaneously with the reuse of the charge so that the time required for conducting each operation is reduced to a half of the time. The configuration of the data drive circuit according to the embodiment of the present invention is shown in FIG. 5. In the drawing, reference P31 denotes a terminal for a d.c. voltage of a data voltage Vd; P32 denotes a terminal for inputting a data voltage of the integrated circuit 3A which serves as the data line drive circuit; P33 denotes a grounded terminal of the integrated circuit 3A. References QP31 to QP3N denote P channel FETs; QN31 to QN3N denote N channel FETs. These elements (pair of QP3N and QN3N) constitute a switch unit for applying a data voltage on each of the data lines DL. References Q31, Q33 and Q35 denote P channel FETs. FET Q31 constitutes a data voltage applying switch (a first switch) and FETs Q33 and Q35 constitute a charge recovering switches (third and fifth switches). References Q32, Q34 and Q36 denote N channel FETs. FETs Q34 and Q36 constitute charge recovering switches (fourth and sixth switches), respectively, and FET Q32 constitutes grounding switch (a second switch). D31 to D34 denote diodes. The diodes D31 and D33 are in series connected with the FETs Q33 and Q35, respectively, and the diodes D32 and D34 are in series connected with the FETs Q34 and Q36, respectively. The diodes D31 and D32 are connected with a series circuit (a first charge storage means) including a charge recovering coil L31 and a charge recovering capacitor C31 at the coupling point PL31 between the diodes D31 and D32. Similarly, the diodes D33 and D34 are connected with a series circuit (a second charge storage means) including a charge recovering coil L32 and a charge recovering capacitor C32 at the coupling point PL32 between the diodes D33 and D34. References PL31 and PL32 denote the potential of a node of the diodes D31 and D33 (cathode of the diodes D32 and D34), respectively.

FIG. 6 shows voltage waveforms in the third embodiment which is shown in FIG. 5. Operation of the circuit in FIG. 5 is described with reference to the voltage waveforms of FIG. 6. The time intervals T31, T33, T35, T37 and T39 are time intervals during which the data pulses are clamped to a constant voltage. The time intervals T32, T34, T36 and T38 are transition time interval during which turning on and off of the data pulses are switched. Operation of the circuit of applying data to pulses on the data lines is described with reference to the waveforms on the output terminal PZ31 in FIG. 6(c) showing the waveform of data pulse. During the time interval T31, a data pulse is applied to a data line which is connected to the output terminal PZ31 so that the potential on the data line is clamped to the data voltage Vd. During the time interval T32, the potential on the data line which is connected to the output terminal PZ31 is lowered. By bringing the FETs QN31 and Q34 conductive, the charge charged on the data line is charged into the charge recovering capacitor C31 with the resonation effect through the output terminal PZ31, FETs QN31 and Q34, diode D32 and the coil L31 for lowering the potential on the data line. Simultaneously with this, by bringing the FETs Q35 and QP3i (i=2 to N )conductive for a data line which is connected to the output terminal PZ3i, the potential of which is to be raised, the charge accumulated in the charge recovering capacitor C32 is charged on the data line with the resonation effect through the coil L32, diode D33, FETs Q35 and QP3i and output terminal PZ3i for raising the potential on the data line.

During the time interval T33, the potential on the data line which is connected to the output terminal PZ31 is clamped to 0V by rendering FETs QN31 and Q36 conductive. During the time interval T34, charge recovery or reused to and in the charge recovering capacitors C31 and C32 is not carried out since the potential on the data line which is connected to the output terminal PZ31 remains lowered. The FET QN31 is rendered inconductive in order to prevent the inflow of the charge from the other output terminals. By bringing the FETs QN3j (j=2 to N) for a data line connected to an output terminal PZ3j, the potential of which is to be lowered, the charge charged on the data line is charged into the charge recovering capacitor C32 with the resonation effect through the output terminal PZ3j, FETs QN3j and Q36, diode D34 and coil L32 for lowering the potential on the data line. Simultaneously with this, by bringing the FETs Q33 and QP3k (k=2 to N) conductive for the data line connected to an output terminal PZ3k (k=2 to N), the potential of which is to be raised, the charge that has been charged on the charge recovering capacitor C31 is charged on the data line with the resonation effect through the coil L31, diode D31, FETs Q33 and QP3k and the output terminal PZ3k for raising the potential on the data line.

During the time interval T36, the potential on the data line which is connected to the output terminal PZ31 is raised. By bringing the FETs Q35 and QP31 conductive, the charge charged on the charge recovering capacitor C32 is charged on the data line with the resonation effect through the coil L32, diode D33, FETs Q35 and QP31 and the output terminal PZ31 to raise the potential on the data line. Simultaneously with this, by bringing the FETs QN3m (m=2 to N) and Q34 conductive for the data line which is connected to the output terminal PZ3m, the potential on which is to be lowered, the charge that has been charged on the data line is charged on the charge recovering capacitor C31 with the resonation effect through the output terminal PZ3m, FETs QN3m and Q34, diode D32 and the coil L31 to lower the potential on the data line. During the time interval T38, charge recovering and reuse to and in the charge recovering capacitors C31 and C32 is not conducted since the potential on the data line which is connected to the output terminal PZ31 remains raised. The FET QP31 is rendered inconductive in order to prevent outflow of the charge to the other output terminal. By bringing the FETs QN3n (n=2 to N) and Q36 conductive for the data line which is connected to the output terminal PZ3n (n=2 to N), the potential on which is to be lowered, the charge charged on the data line is charged on the charge recovering capacitor C32 with the resonation effect through the output terminal PZ3n, FETs QN3n and Q36, diode D34 and the coil L32 to lower the potential on the data line. Simultaneously with this, by bringing the FETs Q33 and QP3o (o=2 to N) conductive for a data line connected to the output terminal PZ3o (o=2 to N), the potential on which is to be raised, the charge which has been charged on the charge recovering capacitor C31 is charged on the data line with a resonation effect through the coil L31, diode D31, FETs Q33 and QP3o and the output terminal PZ3o to raise the potential on the data line.

An advantage which is similar to that of the foregoing two embodiments is obtained by conducting recovery of the charge simultaneously with reuse of the charge through two paths, such as charging and discharging paths by repeating the above mentioned operation. Additionally, the time required for charging and discharging the charge can be shortened to a half of the time required in the previous embodiments. It is necessary to prevent the formation of parasitic diodes on FETs QN21 to QN2N (or QN31 to QN3N), QP21 to QP2Nn (or QP31 to QP3N) by using a process to isolate dielectric materials when the data line drive circuit used in the present invention is fabricated.

Figure 7:
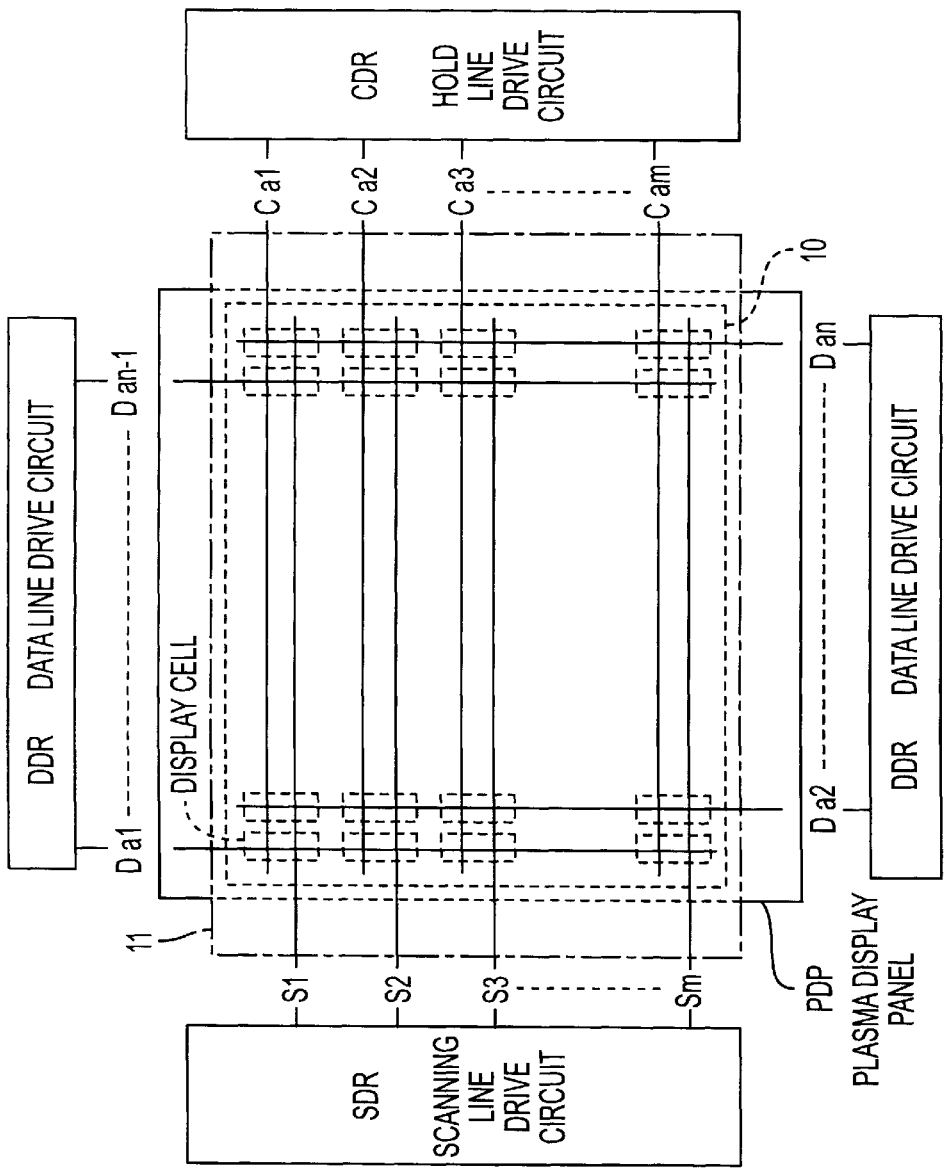
FIG. 7 is a schematic view showing line arrangement of the prior art plasma display panel.
Figure 8:
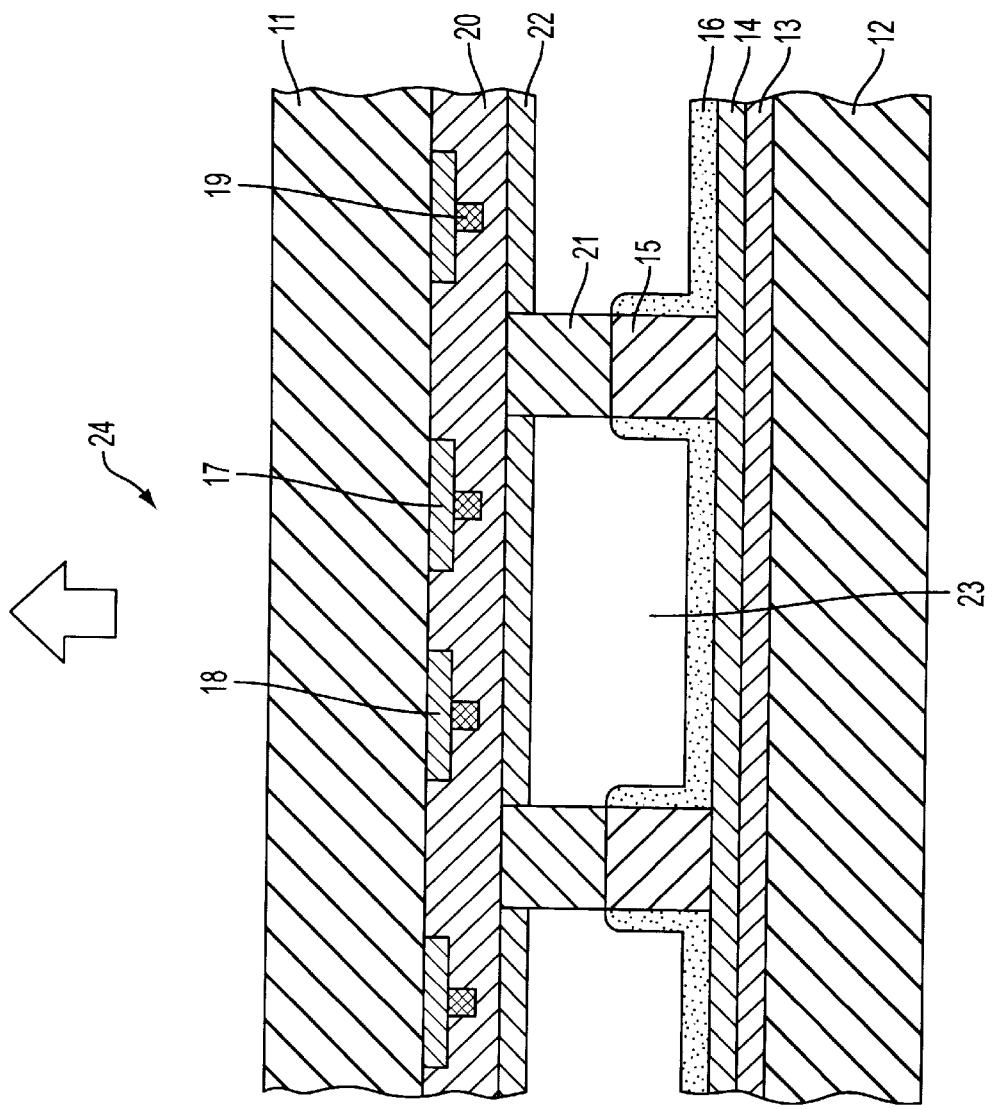
FIG. 8 is a sectional view showing the prior art plasma display panel.
Figure 10:
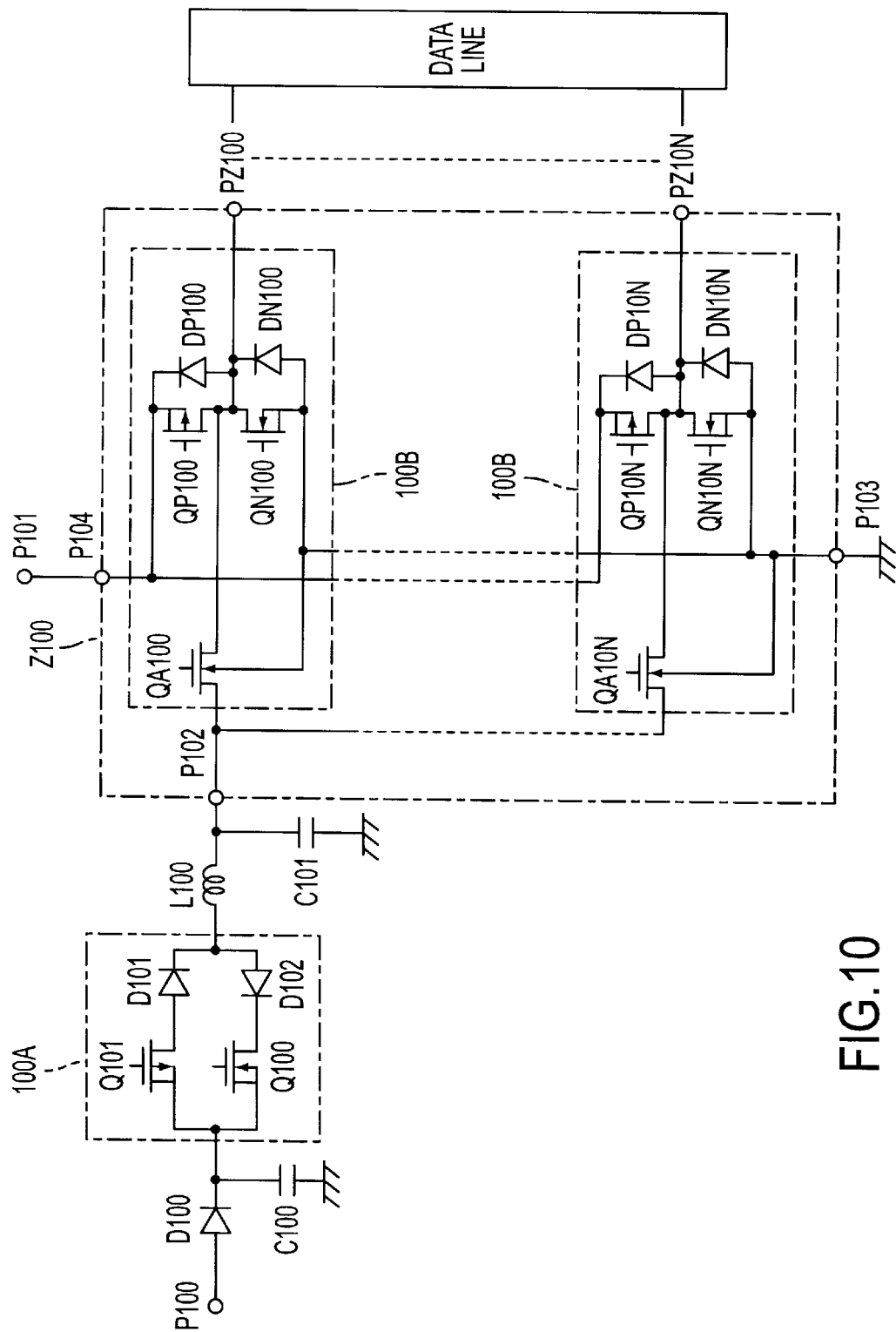
FIG. 10 is a circuit diagram showing an example of a drive device for the plasma display panel.

In the present invention, it is possible to combine foregoing first to third embodiments. Although each embodiment has been described with reference to the plasma display panel having the structure shown in FIGS. 7 and 8, the present invention may be of course applied to the other a.c. and d.c. type driving of the plasma display panel. And the present invention may also be applied to the driving of the other matrix display panels such as electroluminescent panel and liquid crystal panel as well as plasma display panel. Although P channel FET is used as a switch for controlling the recovery of the charge in the first embodiment, N channel FET may be used as well. Although FETs are used as high breakdown voltage switches in each embodiment, bipolar transistors may be used as well as FETs.

The meritorious effects of the invention are summarized as follows.

In a first aspect of the present invention, even when the voltage of the data line exceeds the data voltage due to overshoot on recovery or reuse of the charge on the data line of the matrix display panel, the change can be efficiently recovered since there is no path along which the power corresponding to overshoot is discharged to a data voltage source. The number of activations of the switch for controlling the recovery or non-recovery of the charge can be reduced and the configuration of the whole of the circuit can be simplified, resulting in a saving of power. This simplification of the circuit configuration allows a reduced resistance on recovery or reuse of the charge. No necessity of terminal or wiring for recovering the charge further contributes to simplification of the circuit.

In accordance with the second aspect of the present invention, discrimination (separation) between recovery and non-recovery of charge can be achieved without using any switch for controlling the charge recovery specified for each data line of the matrix display panel. The circuit configuration can be further simplified since the data voltage terminal and grounded terminal are used for recovery or reuse of the charge.

In accordance with the third aspect of the present invention, in addition to an advantage which is similar to that obtained in the second aspect of the invention, the time which is required for recovery or reuse is reduced to a half of the time which was required in the previous embodiments since the operation of recovery or reuse of the charge of the second invention can be conducted simultaneously.

Therefore, in accordance with the present invention, the data line drive device for the matrix display panel can be formed in a simple circuit configuration while the charge on the data lines can be efficiently recovered and reused. Saving in power can be achieved.

It should be noted that other objects of the present invention will become apparent in the entire disclosure and that modifications may be done without departing the gist and scope of the present invention as disclosed herein and appended herewith.

Also it should be noted that any combination of the disclosed and/or claimed elements, matters and/or items may fall under the modifications aforementioned.

What is claimed is:

1. A data line drive device, comprising:

a matrix display panel having a plurality of data lines;

a data line drive circuit which drives said data lines, including a plurality of switch units interposed between a data voltage terminal and each of said data lines;

electrostatic charge storage means for storing electrostatic charge on said data lines, which is connected to said data drive circuit; and a switch which recovers the charge, having a parasitic diode which is interposed between said data line drive circuit and each of said data lines, said charge recovering switch being brought into a conductive state when the charge on the data lines is recovered to said charge storing means.

2. The data line drive device as defined in claim 1 in which said charge recovering switch comprises semiconductor switch elements, said parasitic diodes being parasitic between switch elements and their polarities being arranged so that the data voltage is applied to said data lines.

3. The data line drive circuit as defined in claim 2 in which said data line drive circuit comprises a next output detecting circuit for detecting the data voltage for said data lines during next drive interval, said semiconductor switch elements being controlled to bring it into a conductive or inconductive state in response to a detection output of said next output detecting circuit.

4. The data line drive device as defined in claim 2 in which said semiconductor elements comprise FETs or bipolar transistors.

5. A data line drive device, comprising:

a matrix display panel having a plurality of data lines;

a data line drive circuit which drives said data lines, including a plurality of switch units interposed between a data voltage terminal and each of said data lines;

electrostatic charge storage means for storing electrostatic charge on said data lines, which is connected to said data drive circuit;

a first switch interposed between the data voltage terminal of said data line drive circuit and a data voltage source;

a second switch interposed between a ground terminal of said data line drive circuit and the ground;

a third switch interposed between said data voltage terminal and said charge storage means;

a fourth switch interposed between said ground terminal and said charge storage means; and first and second diodes which are in series connected with said third and fourth switches, respectively, said first and second diodes having such polarities that the charge is recovered and reused between said data line drive circuit and said charge storage means.

6. A data line drive device, comprising:

a matrix display panel having a plurality of data lines;

a data line drive circuit which drives said data lines, including a plurality of switch units interposed between a data voltage terminal and each of said data lines;

a first and second electrostatic charge storage means for storing electrostatic charge on said data lines, which is connected to said data drive circuit;

a first switch interposed between the data voltage terminal of said data line drive circuit and a data voltage source;

a second switch interposed between a ground terminal of said data line drive circuit and the ground;

a third switch interposed between said data voltage terminal and said first charge storage means;

a fourth switch interposed between said ground terminal and said first charge storage means;

a fifth switch interposed between said data voltage terminal and said second charge storage means;

a sixth switch interposed between said ground terminal and said second charge storage means; and first to fourth diodes which are in series connected with said third and sixth switches, respectively, said first to fourth diodes having such polarities that the charge is recovered and reused between said data line drive circuit to said first or second charge storage means.

7. The data line drive device as defined in claim 1 in which said matrix display panel is a plasma display comprising a plurality of data lines which are disposed on the same plane in a parallel relationship with each other, a plurality of scanning lines extending in a direction intersecting with said data lines and display cells, each disposed at the intersection between said data line and scanning line.

8. The data line drive device as defined in claim 5 in which said matrix display panel is a plasma display comprising a plurality of data lines which are disposed on the same plane in a parallel relationship with each other, a plurality of scanning lines extending in a direction intersecting with said data lines and display cells, each disposed at the intersection between said data line and scanning line.

9. The data line drive device as defined in claim 6 in which said matrix display panel is a plasma display comprising a plurality of data lines which are disposed on the same plane in a parallel relationship with each other, a plurality of scanning lines extending in a direction intersecting with said data lines and display cells, each disposed at the intersection between said data line and scanning line.

* * * * *